(12) United States Patent
Ghoshal et al.

(10) Patent No.: US 11,892,204 B2
(45) Date of Patent: Feb. 6, 2024

(54) NESTED FREEZERS FOR STORAGE AND TRANSPORTATION OF COVID VACCINE

(71) Applicant: Sheetak, Inc., Austin, TX (US)

(72) Inventors: Uttam Ghoshal, Austin, TX (US); Brandon Lee Noska, Hallettsville, TX (US)

(73) Assignee: Sheetak, Inc., Austin, TX (US)

( * ) Notice: Subject to any disclaimer, the term of this patent is extended or adjusted under 35 U.S.C. 154(b) by 391 days.

(21) Appl. No.: 17/139,341

(22) Filed: Dec. 31, 2020

(65) Prior Publication Data
US 2022/0163242 A1  May 26, 2022

Related U.S. Application Data
(60) Provisional application No. 63/116,440, filed on Nov. 20, 2020.

(51) Int. Cl.
*F25B 21/02* (2006.01)
*H01L 23/38* (2006.01)
*H10N 10/17* (2023.01)

(52) U.S. Cl.
CPC ............. *F25B 21/02* (2013.01); *H01L 23/38* (2013.01); *H10N 10/17* (2023.02); *F25B 2321/0212* (2013.01)

(58) Field of Classification Search
CPC ......... H01L 23/38; H10N 10/17; F25B 21/02; F25B 2321/0212
See application file for complete search history.

(56) References Cited

U.S. PATENT DOCUMENTS

| | | | |
|---|---|---|---|
| 3,125,860 A | 3/1964 | Reich | |
| 4,833,889 A * | 5/1989 | Harwell | H10N 10/17 62/3.2 |
| 4,971,632 A | 11/1990 | Rowe | |
| 5,237,821 A | 8/1993 | Okumura | |
| 5,375,421 A * | 12/1994 | Hsieh | F24F 5/0042 62/3.4 |
| 5,890,371 A * | 4/1999 | Rajasubramanian | F28D 15/02 62/332 |

(Continued)

OTHER PUBLICATIONS

Examination Report for India App. No. 202017034922 dated May 9, 2022.

(Continued)

*Primary Examiner* — Filip Zec
(74) *Attorney, Agent, or Firm* — Clark Hill PLC

(57) ABSTRACT

The present disclosure is related to nested cooling and heating systems. The cooling system includes an outer cooling assembly with an inner cooling assembly inserted within the outer cooling system. The inner cooling assembly includes thermoelectric coolers, and the outer cooling assembly may be thermoelectric or vapor compression driven. Additional intermediate cooling assemblies may be nested together with the inner and outer cooling assemblies to increase the cooling effect in the innermost cooling assembly. Similarly, the heating system uses nested thermoelectric heating assemblies, and hot temperatures can be increased by adding intermediate nested heating assemblies. Intermediate and/or inner assemblies may be removed from the outer assembly to allow for easy transport.

30 Claims, 12 Drawing Sheets

(56) References Cited

U.S. PATENT DOCUMENTS

| | | | | |
|---|---|---|---|---|
| 6,492,585 | B1 | 12/2002 | Zamboni | |
| 7,448,222 | B2 * | 11/2008 | Bormann | F25D 17/062 |
| | | | | 165/104.33 |
| 8,101,846 | B1 * | 1/2012 | Schroeder | H10N 10/13 |
| | | | | 136/200 |
| 8,468,837 | B2 * | 6/2013 | Pinet | F25B 21/02 |
| | | | | 62/412 |
| 9,391,255 | B2 * | 7/2016 | Chen | H10N 19/101 |
| 9,435,571 | B2 * | 9/2016 | Ghoshal | F25B 21/02 |
| 9,685,599 | B2 * | 6/2017 | Petrovski | F25B 21/02 |
| 10,032,975 | B2 | 7/2018 | Ghoshal | |
| 10,405,667 | B2 * | 9/2019 | Marquette | A47C 7/74 |
| 10,458,683 | B2 * | 10/2019 | Edwards | H10N 10/80 |
| 10,905,113 | B2 * | 2/2021 | Aksan | A01N 1/0231 |
| 11,035,807 | B2 * | 6/2021 | Stautner | F28F 21/085 |
| 2002/0062853 | A1 | 5/2002 | Kajihara | |
| 2005/0016198 | A1 * | 1/2005 | Wowk | A01N 1/0268 |
| | | | | 62/457.2 |
| 2006/0117761 | A1 * | 6/2006 | Bormann | F25B 21/02 |
| | | | | 62/3.6 |
| 2008/0283110 | A1 | 11/2008 | Jin | |
| 2010/0208498 | A1 * | 8/2010 | Rubio | H02M 1/08 |
| | | | | 363/18 |
| 2011/0000224 | A1 | 1/2011 | Ghoshal | |
| 2011/0016886 | A1 | 1/2011 | Ghoshal | |
| 2012/0073276 | A1 | 3/2012 | Meisner | |
| 2012/0090534 | A1 | 4/2012 | Schroeder | |
| 2012/0227923 | A1 | 9/2012 | Field | |
| 2013/0153819 | A1 | 6/2013 | Tseng | |
| 2014/0137918 | A1 | 5/2014 | Zirkle | |
| 2015/0013740 | A1 | 1/2015 | Kaibe | |
| 2015/0159924 | A1 | 6/2015 | Calderon et al. | |
| 2015/0325773 | A1 | 11/2015 | Ghoshal | |
| 2016/0178252 | A1 | 6/2016 | Nakamura et al. | |
| 2016/0372650 | A1 | 12/2016 | Ghoshal et al. | |
| 2018/0337321 | A1 | 11/2018 | Ghoshal | |
| 2018/0366629 | A1 | 12/2018 | Ghoshal et al. | |

OTHER PUBLICATIONS

Patent Cooperation Treaty International Search Report and Written Opinion dated Feb. 4, 2022, International Application No. PCT/US21/59858, (5 pages).

Patent Cooperation Treaty International Search Report and Written Opinion dated Feb. 4, 2022, International Application No. PCT/US21/59858, (17 pages).

* cited by examiner

NESTED FREEZERS FOR STORAGE AND TRANSPORTATION OF COVID VACCINE

BACKGROUND OF THE DISCLOSURE

1. Field of the Disclosure

The present disclosure relates to apparatuses and methods for thermal regulation, and nested heating and refrigeration involving thermoelectric devices.

2. Description of the Related Art

Refrigeration technologies have been around for centuries, from use of running water and evaporation to the ice box and the motorized, compressor-based refrigeration systems. Thermoelectric devices have been used since the 1900s to heat, cool, and generate power; however, widespread use has been held back due to poor performance and low efficiency when compared with other available heating, cooling, and power generation technologies.

A shortcoming in prior art refrigeration systems is their limited temperature differential and dependence on vapor compressor cooling, which limits the ability to nest cooling systems. Another shortcoming in prior art refrigeration systems is the use of moving parts that are subject to wear, breakage, noise product. Another shortcoming in prior art refrigeration systems is the size and mass of the compressor and associated parts, which greatly reduce the ease of portability and placement of the refrigeration system. Another shortcoming in prior art refrigeration is the difficulty of interfacing renewable energy sources, such as solar panels and wind turbines, to the compressor-based refrigeration systems. Another shortcoming in prior art refrigeration is the difficulty in providing fault-tolerant, distributed multiple compressors systems.

What is needed is a refrigeration system that can be nested with new or existing cooling or heating systems, does not require greenhouse gases as a refrigerant, uses non-moving parts to provide cooling, and is lightweight and easily transportable, and can achieve ultracold temperatures. In addition, a refrigeration system is needed that can be powered by non-power grid alternative power sources, such as solar panels, and exhibits fault-tolerant redundancy.

BRIEF SUMMARY OF THE DISCLOSURE

In aspects, the present disclosure is related to an apparatus and method for using nested heating and refrigeration systems, and, in particular, using thermoelectric devices to provide refrigeration.

One embodiment according to the present disclosure includes a nested thermal cooler system, the system including a first cooling assembly and a second cooling assembly disposed inside the first cooling assembly. The first cooling assembly includes a first housing; a first cooling apparatus inside the first housing; and a first thermal conductive layer forming a first cavity inside the first housing. The second cooling assembly is disposed within the first cavity and includes a second housing; a second cooling apparatus including at least one thermoelectric module embedded in the second housing; and a second thermal conductive layer forming a second cavity inside the second housing. The first housing and the second housing may be thermally insulated. The first cooling assembly may cool based on thermoelectric modules or vapor compression. The thermally conductive layers may include a thermally conductive material and, optionally, a phase change material embedded in the thermally conductive material. The phase change materials may be different based on the particular thermally conductive layer. The system may also include one or more power sources to power to cooling assemblies. In some embodiments, different cooling assemblies may operate, at least for a time, off separate power sources. The second cooling assembly may be configured for removal and reinsertion into the first cooling assembly. In some embodiments, the first and second cooling assemblies may have corresponding threads to facilitate insertion and removal. In some embodiments, there is a third cooling assembly that may be disposed within the second cooling assembly. The third cooling assembly may include a third housing, a third cooling apparatus including at least one thermoelectric module embedded in the third housing, and a third thermal conductive layer forming a third cavity inside the third housing. In some embodiments, the third cooling assembly is removable and insertable into the second cooling assembly. The third cooling assembly may even have threads corresponding to threads on the second cooling assembly to facilitate removal and insertion.

Another embodiment according to the present disclosure includes a nested thermal heater system, the system including a first heating assembly and a second heating assembly disposed inside the first heating assembly. The first heating assembly includes a first housing; a first heating apparatus inside the first housing; and a first thermal conductive layer forming a first cavity inside the first housing. The second heating assembly is disposed within the first cavity and includes a second housing; a second heating apparatus including at least one thermoelectric module embedded in the second housing; and a second thermal conductive layer forming a second cavity inside the second housing. The first housing and the second housing may be thermally insulated. The first heating assembly may heat based on thermoelectric modules. The thermally conductive layers may include a thermally conductive material and, optionally, a phase change material embedded in the thermally conductive material. The phase change materials may be different based on the particular thermally conductive layer. The system may also include one or more power sources to power to heating assemblies. In some embodiments, different heating assemblies may operate, at least for a time, off separate power sources. The second heating assembly may be configured for removal and reinsertion into the first heating assembly. In some embodiments, the first and second heating assemblies may have corresponding threads to facilitate insertion and removal. In some embodiments, there is a third heating assembly that may be disposed within the second heating assembly. The third heating assembly may include a third housing, a third heating apparatus including at least one thermoelectric module embedded in the third housing, and a third thermal conductive layer forming a third cavity inside the third housing. In some embodiments, the third heating assembly is removable and insertable into the second heating assembly. The third heating assembly may even have threads corresponding to threads on the second heating assembly to facilitate removal and insertion.

Another embodiment according to the present disclosure includes a method of cooling using a nested thermal cooler system, the system including a first cooling assembly and a second cooling assembly disposed inside the first cooling assembly. The first cooling assembly includes a first housing; a first cooling apparatus inside the first housing; and a first thermal conductive layer forming a first cavity inside the first housing. The second cooling assembly is disposed within the first cavity and includes a second housing; a second cooling apparatus including at least one thermoelectric module embedded in the second housing; and a second thermal conductive layer forming a second cavity inside the second housing. The method includes energizing the first and second cooling assemblies. The method may also include removing the second cooling assembly from the cavity of the first cooling assembly. The method may include inserting the second cooling assembly into the first cavity of the first cooling assembly.

Another embodiment according to the present disclosure includes a method of heating using a nested thermal heater system, the system including a first heating assembly and a second heating assembly disposed inside the first heating assembly. The first heating assembly includes a first housing; a first heating apparatus inside the first housing; and a first thermal conductive layer forming a first cavity inside the first housing. The second heating assembly is disposed within the first cavity and includes a second housing; a second heating apparatus including at least one thermoelectric module embedded in the second housing; and a second thermal conductive layer forming a second cavity inside the second housing. The method includes energizing the first and second heating assemblies. The method may also include removing the second heating assembly from the cavity of the first heating assembly. The method may include inserting the second heating assembly into the first cavity of the first heating assembly.

Examples of the more important features of the disclosure have been summarized rather broadly in order that the detailed description thereof that follows may be better understood and in order that the contributions they represent to the art may be appreciated. There are, of course, additional features of the disclosure that will be described hereinafter and which will form the subject of the claims appended hereto.

BRIEF DESCRIPTION OF THE DRAWINGS

For a detailed understanding of the present disclosure, reference should be made to the following detailed description of the embodiments, taken in conjunction with the accompanying drawings, in which like elements have been given like numerals, wherein.

DETAILED DESCRIPTION OF THE DISCLOSURE

Figure 1:
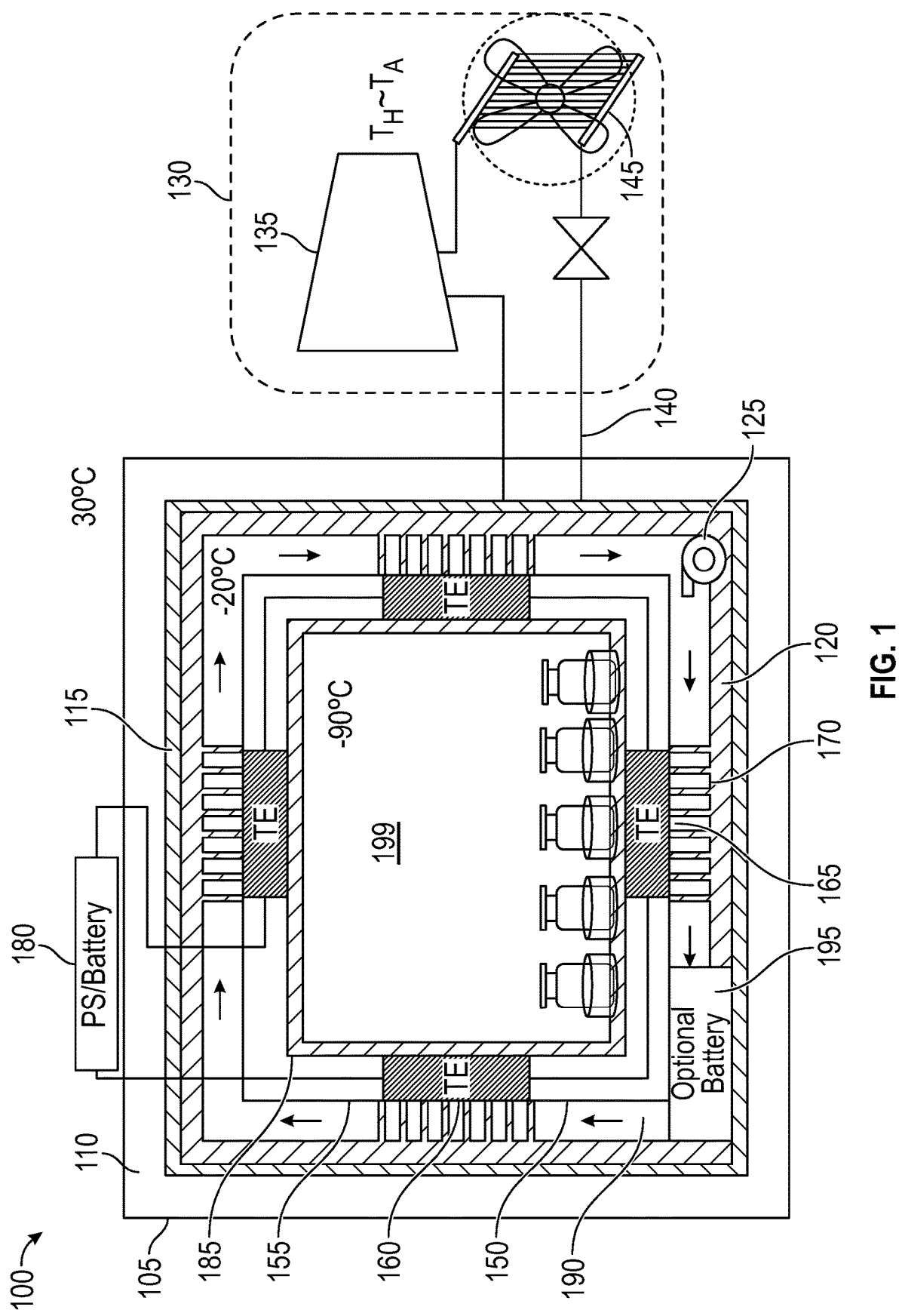
FIG. 1 is a diagram of a cooling system with a thermoelectric cooling apparatus nested with a vapor compression cooling apparatus according to one embodiment of the present disclosure.

Generally, the present disclosure relates to apparatuses and methods for nested heating and refrigeration systems and using thermoelectric devices for refrigeration. The present disclosure is susceptible to embodiments of different forms. They are shown in the drawings, and herein will be described in detail, specific embodiments of the present disclosure with the understanding that the present disclosure is to be considered an exemplification of the principles of the present disclosure and is not intended to limit the present disclosure to that illustrated and described herein.

FIG. 1 shows a cooling system 100 according to one embodiment of the present disclosure. The cooling system 100 may include a cooling unit 105, such as a refrigerator or freezer, a vapor compressor apparatus 130, and a thermoelectric cooling assembly 150. The cooling unit 105 may include an insulated shell 110 or housing with insulated walls, a plurality of cooling coils 115, and an interior wall 120 forming a cavity 190. An air mover 125, such as a blower or fan, may be disposed in the cavity 190 to circulate air. The cooling coils 115 may be in fluid communication with the vapor compressor apparatus 130 via cooling lines 140, so that coolant may circulate between the cooling unit 105 and the vapor compressor apparatus 130. The vapor compressor apparatus 130 may include a compressor 135 and a cooling fan 145 for removing heat to ambient from the cooling lines 140. The thermoelectric cooling assembly 150 is configured to be disposed within the cooling unit 105 and provides cooling separate from the cooling coils 115 and the vapor compressor apparatus 130.

The thermoelectric cooling assembly 150 may include an insulated shell 155 with one or more embedded thermoelectric modules 160. While four thermoelectric modules 160 are shown, there may be more or fewer than four thermoelectric modules 160. Further, the thermoelectric modules 160 may be single-stage, two-stage, or three-stage module, as would be understood by a person of ordinary skill in the art. Some non-limiting examples of suitable thermoelectric modules are AMS-241-1.7-1.5, and AMS-71-1.2-1 Peltier Modules, both manufactured by Sheetak, Inc. in Austin, Texas. The thermoelectric modules 160 are disposed with their hot sides in contact with heat sinks 165 and their cold sides in contact with an inner metal wall 185 that forms an interior cavity 199 for keeping items cold at a controlled temperature. The thermoelectric modules 160 absorb heat from the interior cavity 199, through the metal wall 185, and reject heat into the heat sinks 165. The heat sinks 165 may include fins 170 to radiate heat into the cavity 190. The fins 170 may be made of a thermally conductive material, such as aluminum or graphite. Other suitable materials for the fins 170 may include, but are not limited to, copper, silicon, aluminum nitrides, and diamond. Air circulation in the cavity 190 may be provided by the air mover 125 even when the thermoelectric cooling assembly 150 is placed within the cavity 190. In some embodiments, the fins 170 may be aligned with the direction of air flow from the air mover 125 to enhance heat movement. While four sets of fins 170 are shown, there may be fins 170 on more than or fewer than four sides. In some embodiments, at least some of the fins 170 may be designed to support the weight of the thermoelectric cooling assembly 150 such that it can stand on its own when inserted or removed from the cavity 190. In some embodiments, the thermoelectric cooling assembly 150 may be secured within the cooling unit 105 so that it is not easily removed or shifted during transport, such as by wave motion, rough roads, or turbulence, depending on the mode of transport.

An external power source 180 disposed outside of the cooling unit 105 may be in electrical communication with the thermoelectric modules 160. The power source may be an external power line, battery, or other suitable electrical power source. While power lines are shown connecting the external power source 180 to the thermoelectric modules 160, this is exemplary and illustrative only, as the external power source 180 may supply power without a physical connection with the thermoelectric modules 160, such as with an inductive power transmission system. In some embodiments, an optional internal power supply 195 may be disposed in the annulus of the cavity 190 between the interior shell 185 and the thermoelectric cooling assembly 150. The internal power supply 195 include a battery selected to operate at the low temperatures consistent with the cavity 190 when the cooling unit 105 is operating, for example, about −20° C. In some instances, the internal power supply 195 may be a lithium iron phosphate battery.

While the cooling system 100 is shown as substantially cube-shaped, this is illustrative and exemplary only, as the cooling system 100 may be substantially rectangular, spherical, cylindrical in shape or any other shape as would be understood by a person of skill in the art. In some embodiments for air (drone) and underwater (submarine) transportations, the shape may be 3D airfoil or ellipsoid. Further, the thermoelectric cooling assembly 150 may or may not conform to the shape of the cavity 190, nor does the shape of the cavity 190 need to match the shape of the insulated shell 110.

Figure 2A:
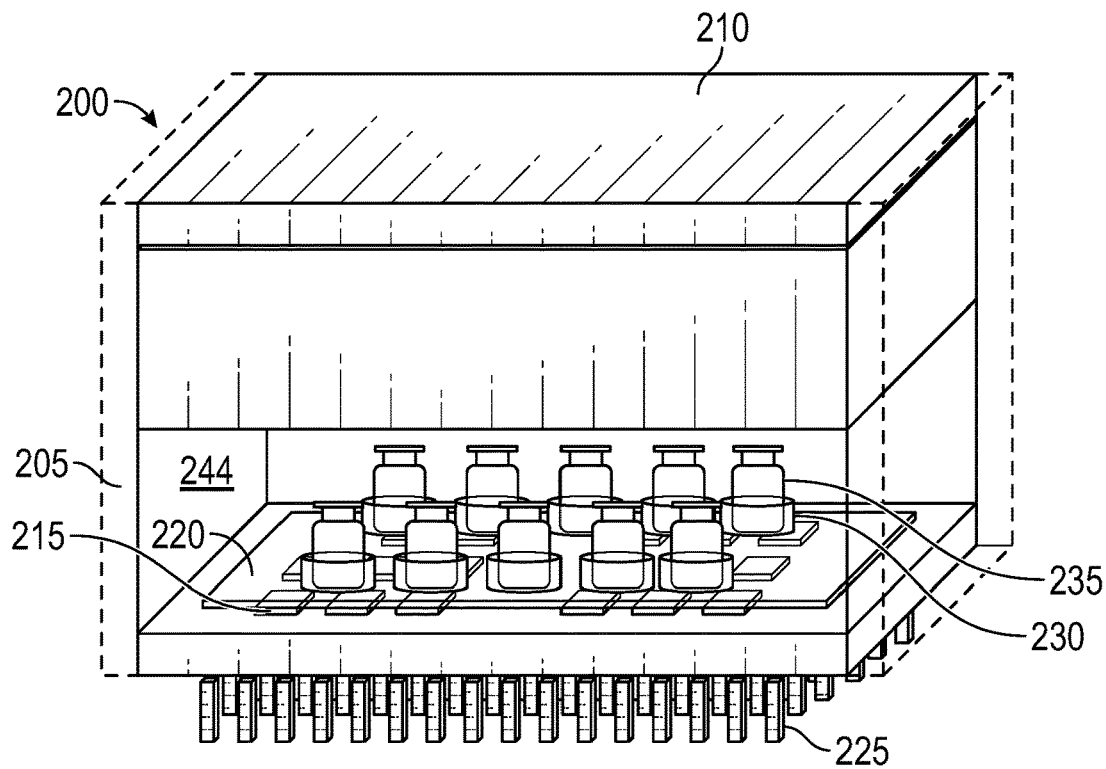
FIG. 2A is a 3-D diagram of a thermoelectric apparatus that can be inserted in the vapor compression cooling apparatus of FIG. 1.

FIG. 2A shows a 3-D diagram of a thermoelectric cooler 200 that can be placed inside an existing cooling unit 105 or any other suitable cooling unit, including, but not limited to, a thermoelectric cooler. The thermoelectric cooler 200 is variation of the thermoelectric cooling assembly 150. The thermoelectric cooler 200 includes an insulated housing 205 with an insulated lid 210. At least one part of the insulated housing 205 has one or more thermoelectric modules 215 embedded with their cold sides in thermal communication with a thermally conductive plate 220 in the cavity 244 formed by the housing 205.

The thermoelectric modules 215 may be single-stage, two-stage, or three-stage module, as would be understood by a person of ordinary skill in the art. The hot sides of the thermoelectric modules 215 may be in thermal communication with one or more of a plurality of fins 225 or other thermal conductors, such as thermal diodes or mechanical thermal isolators, for removing heat from the hot sides of the thermoelectric modules 215.

The fins 225 may be made of a thermally conductive material, such as aluminum or graphite. Other suitable materials for the fins 225 may include, but are not limited to, copper, silicon, aluminum nitrides, and diamond. The fins 225 are disposed to support the weight of the thermoelectric cooler 200 and to provide a gap between the housing 205 and the interior shell 185 (when the cooler 200 is installed in the cooling unit 105) for air circulation to facilitate heat transfer.

In some embodiments, the thermally conducting plate 220 may include a phase change material (PCM) (not shown). The PCM may be embedded within the thermally conducting plate 220 and stabilize the temperature of the cavity 244, especially when the thermoelectric cooler 200 is unpowered or has an uneven power supply. Suitable PCMs may include, for non-limiting, examples, water ice, dry ice, specialized hydrocarbons and organic waxes, and Eutectic and E range PCMs available from Phase Change Material Products Limited, in Hertfordshire, Great Britain. In some embodiments, receptacles 230 for receiving articles 235 for storage may be disposed on the thermally conducting plate 220. The receptacles 230 may be affixed or stabilized to protect the articles 235, such as bottles, vials and syringes, from damage due to the shifting of the thermoelectric cooler 200. In some embodiments, the receptacles 230 may be grouped in trays or arrays that can be removed all together or in groups. The grouped trays may be secured or free standing.

Figure 2B:
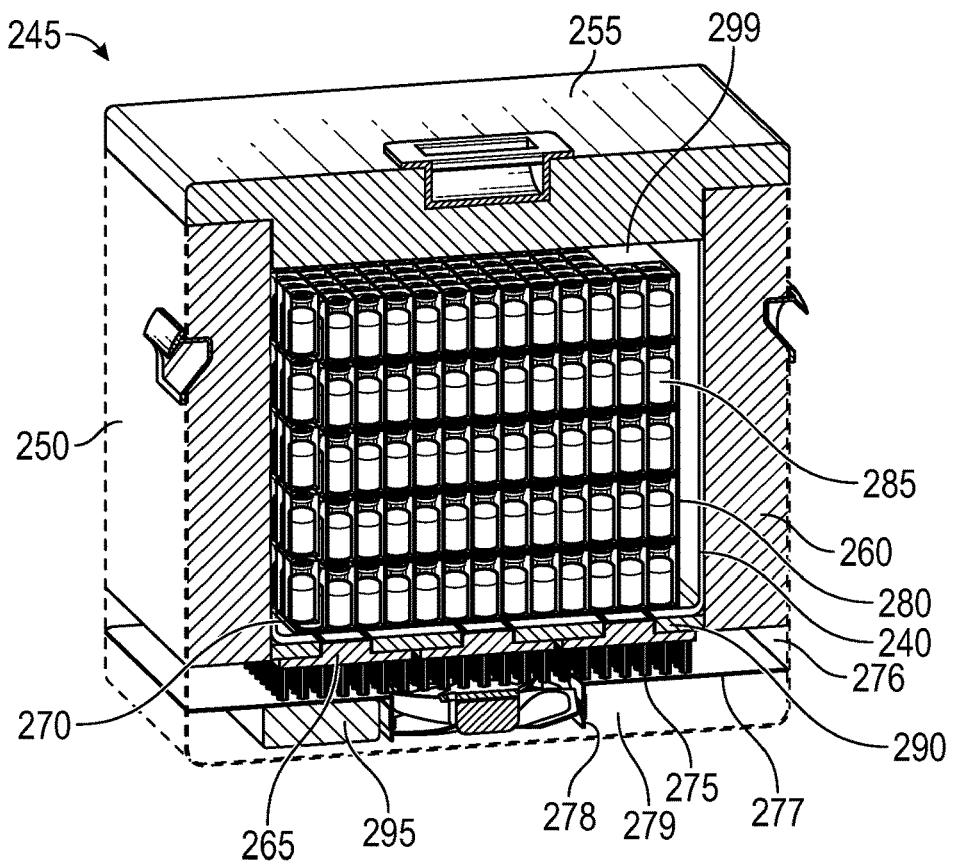
FIG. 2B is a 3-D diagram of another thermoelectric apparatus that can be inserted in the vapor compression cooling apparatus of FIG. 1.

FIG. 2B shows a 3-D diagram of a thermoelectric cooler 245 that can be placed inside an existing cooling unit 105 or any other suitable cooling unit, including, but not limited to, a thermoelectric cooler. The thermoelectric cooler 245 is variation of the thermoelectric cooling assembly 150 designed to be easily inserted and removed from the cooling unit 105. The thermoelectric cooler 245 includes an insulated housing 250 with an insulated lid 255 and an internal base 260. At least one part of the internal base 260 may include one or more thermoelectric modules 265 embedded with their cold sides in thermal communication with a thermally conductive plate 270 in the cavity 299 formed by the housing 255 and the internal base 260.

The thermoelectric modules 265 may be single-stage, two-stage, or three-stage module, as would be understood by a person of ordinary skill in the art. The hot sides of the thermoelectric modules 265 may be in thermal communication with one or more of a plurality of fins 275 or other thermal conductors, such as thermal diodes or mechanical thermal isolators, for removing heat from the hot sides of the thermoelectric modules 265.

The fins 275 may be made of a thermally conductive material, such as aluminum or graphite. Other suitable materials for the fins 275 may include, but are not limited to, copper, silicon, aluminum nitrides, and diamond. The fins 275 may extend into a cavity 276 that is formed by the housing 255, the internal base 260, and a sheet 277. An air mover 278 may be disposed in may circulate air in the cavity 276 to facilitate removal of heat from the fins 275. The air mover 278 may be disposed in the cavity 276 or another cavity 279 between the sheet 277 and the housing 255. A power supply 295 in electrical communication with the thermoelectric modules 265 may be disposed in the cavity 279. In some embodiments, the thermally conducting plate 270 may include a phase change material (PCM) (not shown) as discussed for the cooling system 100.

The PCM may be embedded within the thermally conducting plate 270 and stabilize the temperature of the cavity 299, especially when the thermoelectric cooler 245 is unpowered or has an uneven power supply. In some embodiments, a metal liner 290 may be disposed in the cavity 299 and rest on the thermally conducting plate 270. In other embodiments, the metal liner 290 may be rest on the thermoelectric modules 265, and the conductive plate 270 may rest on the floor for of the metal liner 290. The metal liner 290 may be configured to receive receptacles 280 for storing or receiving articles 285 to be cooled. The receptacles 280 may be affixed or stabilized to protect the articles 285, such as bottles, vials and syringes, from damage due to the shifting of the thermoelectric cooler 245. In some embodiments, the receptacles 280 may be grouped in trays or arrays that can be removed all together or in groups. The grouped trays may be stacked or unstacked and secured or free standing. In some embodiments, the receptacles 280 for receiving articles 285 for storage may be disposed on the thermally conducting plate 270.

Figure 3:
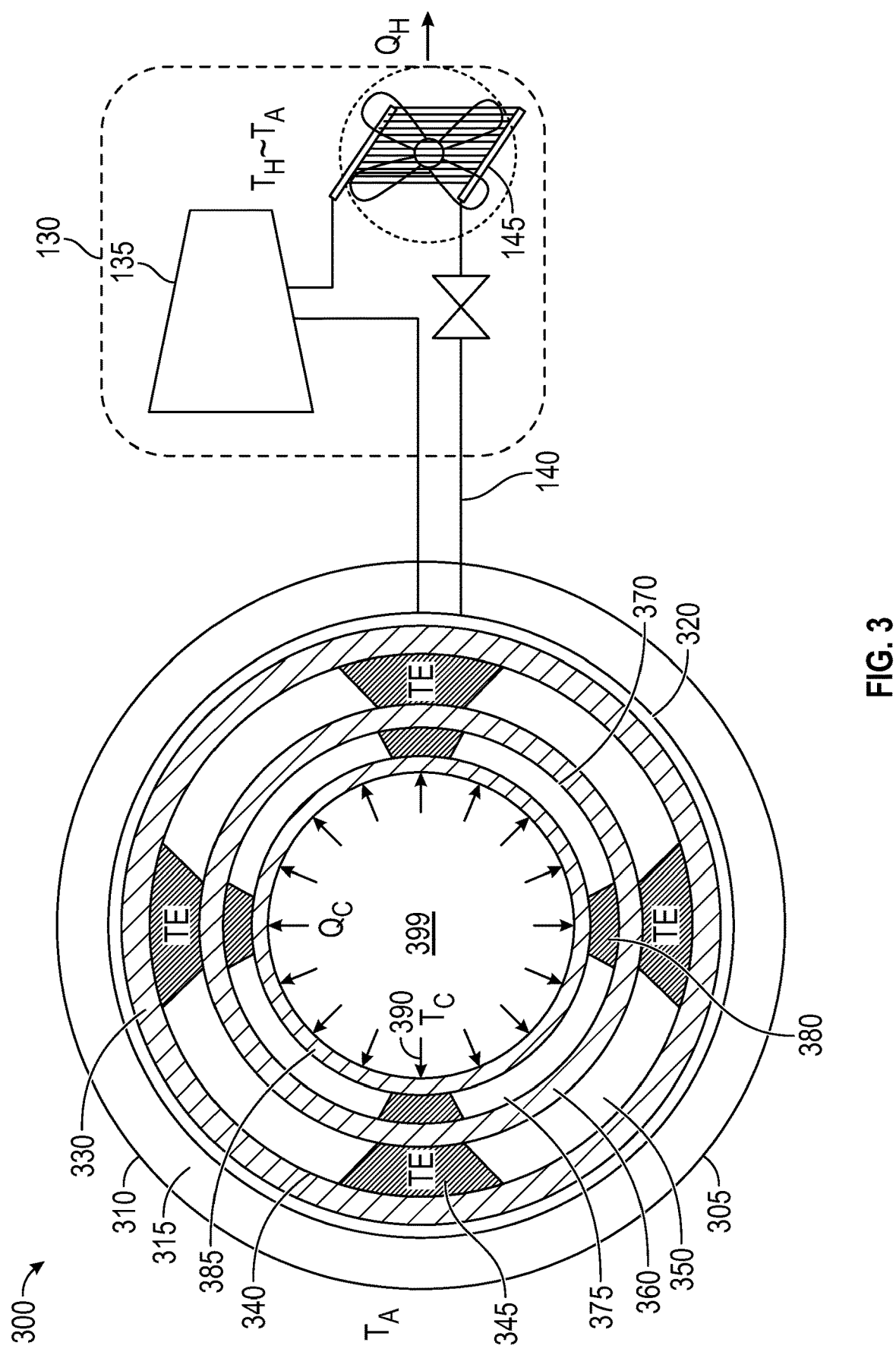
FIG. 3 is a diagram of a nested two-stage thermoelectric cooler apparatus inside a vapor compression cooler according to another embodiment of the present disclosure.

FIG. 3 shows a diagram of a nested thermoelectric cooler 300 according to one embodiment of the present disclosure. The nested thermoelectric cooler 300 includes two or more cooling assemblies organized so that one or more inner cooling assemblies are surrounded by one or more outer cooling assemblies. As the number of total cooling assemblies increases, the temperature difference between the outermost cooling assembly and the interior of the innermost cooling assembly increases. FIG. 3 shows a cooler 300 with three cooling assemblies 305, 340, 370. The outer cooling assembly 305 may include a housing 310 holding an insulation layer 315 that surrounds a plurality of cooling coils 320, and an inner thermally conductive layer 330. The cooling coils 320 may be in fluid communication with the vapor compressor apparatus 130 such as shown in FIG. 1. The inner thermally conductive layer 330 forms the boundary for an interior space for the intermediate cooling assembly 340.

The intermediate cooling assembly 340 may include an insulation layer 350 with one or more thermoelectric modules 345 embedded therein. The hot sides of the thermoelectric modules 345 are in thermal communication with the inner thermally conductive layer 330, and the cold sides of the thermoelectric modules 345 are in thermal communication with a thermally conductive layer 360. The thermally conductive layer 360 forms a cavity that holds the inner cooling assembly 370. The inner cooling assembly 370 may include an insulation layer 375 with one or more thermoelectric modules 380 embedded therein. The hot sides of the thermoelectric modules 380 are in thermal communication with the intermediate thermally conductive layer 360, and the cold sides of the thermoelectric modules 380 may be in thermal communication with a thermally conductive layer 385. The thermally conductive layer 385 forms an interior cavity 399 where articles to be maintained at cold temperatures may be stored. As shown by arrows 390, heat flows out from the cavity 399 toward the outer cooling assembly 305.

In some embodiments, the cooling assemblies 340, 370 may be configured for easy removal from the cooler 300. The inner surface of the cooling assembly 305 and the outer surface of the cooling assembly 340 may be threaded or smooth to allow easy removal and installation. In some embodiments, the cooling assembly 305 may have a separate power source from one or both inner assemblies 340, 370, so that, when separated, the temperature of the cooling temperature 399 may be maintained at low temperatures. In some instances, the outermost cooling assembly 305 may be used to "cold charge" the inner cooling assemblies 340, 370, for instance when the inner assemblies 340, 370 have a limited power source, such as a battery, and the outer assembly 305 enjoys access to a power line. In some embodiments, the thermally conductive layers 330, 360, 385 may be made of metal. The insulation layers 315, 350, 375 are thermally insulating.

In some embodiments, one or more of the insulation layers 315, 350, 375 are also electrically insulating. The insulation layers 315, 350, 375 may be made of any suitable thermally insulating material including aerogels. In some embodiments, one or more of the insulation layers 315, 350, 375 may be a vacuum, a thermal insulation based on aerogels, or a combination thereof. The thermoelectric modules 345, 380 may be single-stage, two-stage, or three-stage modules, as would be understood by a person of ordinary skill in the art. The number of stages in the thermoelectric modules 345, 380 may vary from cooling assembly 340, 370 to cooling assembly 340, 370 or even with in a cooling assembly 340, 370. Depending on the cooling temperature required, the thermoelectric modules 345, 380 may be selected based on their efficiency at their respective stages (inner, intermediate). The thermoelectric materials and/or structures used in the thermoelectric modules 345, 380 may differ from based on these temperature performance requirements of each cooling assembly 340, 370. For example, a two-stage thermoelectric module may be used to lower the cold side of the thermoelectric module 345 to about −50° C. and a three-stage thermoelectric module may be selected to lower the cold side of the thermoelectric module 380 to about −90° C. In some embodiments, the thermoelectric modules 345, 380 may be of the same type but operating across different temperature ranges, as would be understood by a person of ordinary skill in the art. Materials for the thermoelectric modules 345, 380 may be selected to optimize or improve performance in specific temperature ranges. For example, a thin film B—Sb—Te—Se alloy may be used to increase the figure of merit ZT above 1.5 in some embodiments. In some embodiments, the thermoelectric modules 380 may be powered by electrical currents directly from the cold side of the thermoelectric modules 345, as part of an extended electrical circuit.

In some embodiments, one or more of the thermally conducting layers 330, 360, 385 may include a phase change material (PCM) (not shown). The PCMs may be selected from the same group as used in the thermally conducting plate 220. The PCM may be embedded within one or more of the thermally conducting layers 330, 360, 385 and stabilize the temperature of the cavity 399, especially when the thermoelectric cooler 300 is unpowered or has an uneven power supply. The PCMs may be different for each of the thermally conducting layers 330, 360, 385 based on the desired temperatures for the interiors of each of the respective cooling assemblies 305, 340, 370, as would be understood by a person of ordinary skill in the art. While not shown, each of the thermoelectric modules 345, 380 may receive power from a power source, such as, but not limited to, a power line, battery, or inductive charging unit.

In operation, the thermoelectric cooler 300 allows the cooling assemblies 305, 340, 370 to be nested like Matryoshka dolls with each nested assembly providing deeper cold. Since each assembly provides its cooling, the internal cavity temperature is basically single cooled (cold), double cooled (very cold), or triple cooled (ultracold). Cold temperatures may be from about 0° C. to about −20° C., very cold temperatures may be from about −20° C. to about −60° C., and ultracold temperatures may be from about −60° C. to about −120° C.

For ultracold temperatures, all the cooling assemblies 305, 340, 370 may be required. For very cold temperatures, the inner assemblies 340, 370 can be removed and transported while relying on internal power and/or cold maintained by PCMs. After transportation of their contents, the assemblies 340, 370 can be reinserted in the cooling assembly 305. For cold temperatures, the innermost assembly 370 may be removed and transported, or both inner assemblies 340, 370 may be removed but only one actively cooling.

Figure 4:
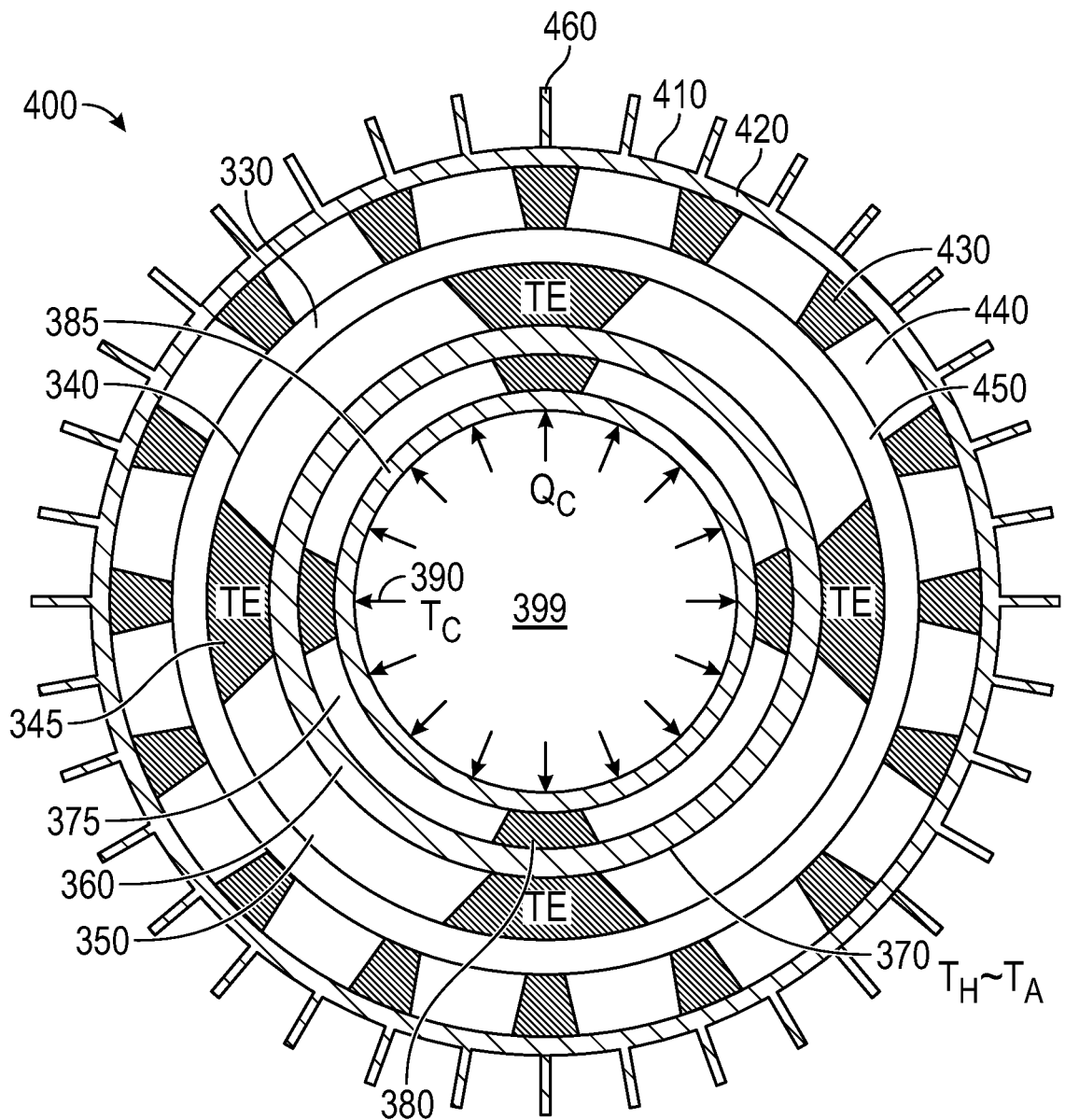
FIG. 4 is a diagram of a three-stage nested thermoelectric cooler apparatus according to one embodiment of the present disclosure.

FIG. 4 shows a diagram of a nested thermoelectric cooler 400 according to one embodiment of the present disclosure. The nested thermoelectric cooler 400 is like the nested thermoelectric cooler 300, except that the outermost cooling assembly 305, which is a vapor compression cooler, has been replaced by a thermoelectric cooler. Thus, a compressor assembly 130 is not needed. The nested thermoelectric cooler 400 includes two or more cooling assemblies organized so that one or more inner cooling assemblies are surrounded by one or more outer cooling assemblies. As shown, the nested thermoelectric cooler 400 has three cooling assemblies 410, 340, 370. The outer cooling assembly 410 may include a housing 420 holding an insulation layer 440 that is embedded by thermoelectric modules 430, and an inner thermally conductive layer 450. The inner thermally conductive layer 450 forms the boundary for an interior space for the intermediate cooling assembly 340. The housing 420 is thermally conductive and may act as a heat sink that is in thermal communication with the hot sides of the one or more thermoelectric modules 430. In some embodiments, fins 460 may be disposed on the housing 420 to aid in the removal of heat to ambient. The fins 460 may be made of a thermally conductive material, such as aluminum or graphite. Other suitable materials for the fins 460 may include, but are not limited to, copper, silicon, aluminum nitrides, and diamond.

The intermediate cooling assembly 340 may include the insulation layer 350 with one or more thermoelectric modules 345 embedded therein. The hot sides of the thermoelectric modules 345 are in thermal communication with the inner thermally conductive layer 330, and the cold sides of the thermoelectric modules 345 are in thermal communication with a thermally conductive layer 360. The thermally conductive layer 360 forms a cavity that holds the inner cooling assembly 370. The inner cooling assembly 370 may include an insulation layer 375 with one or more thermoelectric modules 380 embedded therein. The hot sides of the thermoelectric modules 380 are in thermal communication with the intermediate thermally conductive layer 360, and the cold sides of the thermoelectric modules 380 may be in thermal communication with a thermally conductive layer 385. The thermally conductive layer 385 forms an interior cavity 399 where articles to be maintained at cold temperatures may be stored. As shown by arrows 390, heat flows out from the cavity 399 toward the outer cooling assembly 305.

In some embodiments, the cooling assemblies 340, 370 may be configured for easy removal from the cooler 400. The inner surface of the cooling assembly 410 and the outer surface of the cooling assembly 340 may be threaded or smooth to allow easy removal and installation. In some embodiments, the cooling assembly 410 may have a separate power source from one or both inner assemblies 340, 370, so that, when separated, the temperature of the cooling temperature 399 may be maintained at low temperatures. In some instances, the outermost cooling assembly 410 may be used to "cold charge" the inner cooling assemblies 340, 370, for instance when the inner assemblies 340, 370 have a limited power source, such as a battery, and the outer assembly 410 enjoys access to a power line. In some embodiments, the thermally conductive layers 450, 360, 385 may be made of metal. The insulation layers 440, 350, 375 are thermally insulating. In some embodiments, one or more of the insulation layers 440, 350, 375 are also electrically insulating. The insulation layers 440, 350, 375 may be made of any suitable thermally insulating material including aerogels. In some embodiments, one or more of the insulation layers 440, 350, 375 may be a vacuum, a thermal insulation based on aerogels, or a combination thereof.

The thermoelectric modules 430, 345, 380 may be single-stage, two-stage, or three-stage modules, as would be understood by a person of ordinary skill in the art. The number of stages in the thermoelectric modules 430, 345, 380 may vary from cooling assembly 410, 340, 370 to cooling assembly 410, 340, 370 or even with in a cooling assembly 410, 340, 370. Depending on the cooling temperature required, the thermoelectric modules 430, 345, 380 may be selected based on their efficiency at their respective stages (inner, intermediate, outer). The thermoelectric materials used therein may differ between the thermoelectric modules 430, 345, 380 based on these temperature performance requirements of each cooling assembly 410, 340, 370. In some embodiments, one or more of the thermoelectric modules 430, 345, 370 may be use thermoelectric modules suitable for the thermoelectric modules 160. While not shown, each of the thermoelectric modules 430, 345, 380 may receive power from a power source, such as, but not limited to, a power line, battery, or inductive charging unit. In some embodiments, the thermoelectric modules 380 may be powered by electrical currents directly from the cold side of the thermoelectric modules 345, and in turn be connected to the cold side of the thermoelectric modules 430, as part of an extended electrical circuit.

In operation, the thermoelectric cooler 400 may be operated in a similar fashion to the thermoelectric cooler 300, except with cooling assemblies 410, 340, 370.

Figure 5:
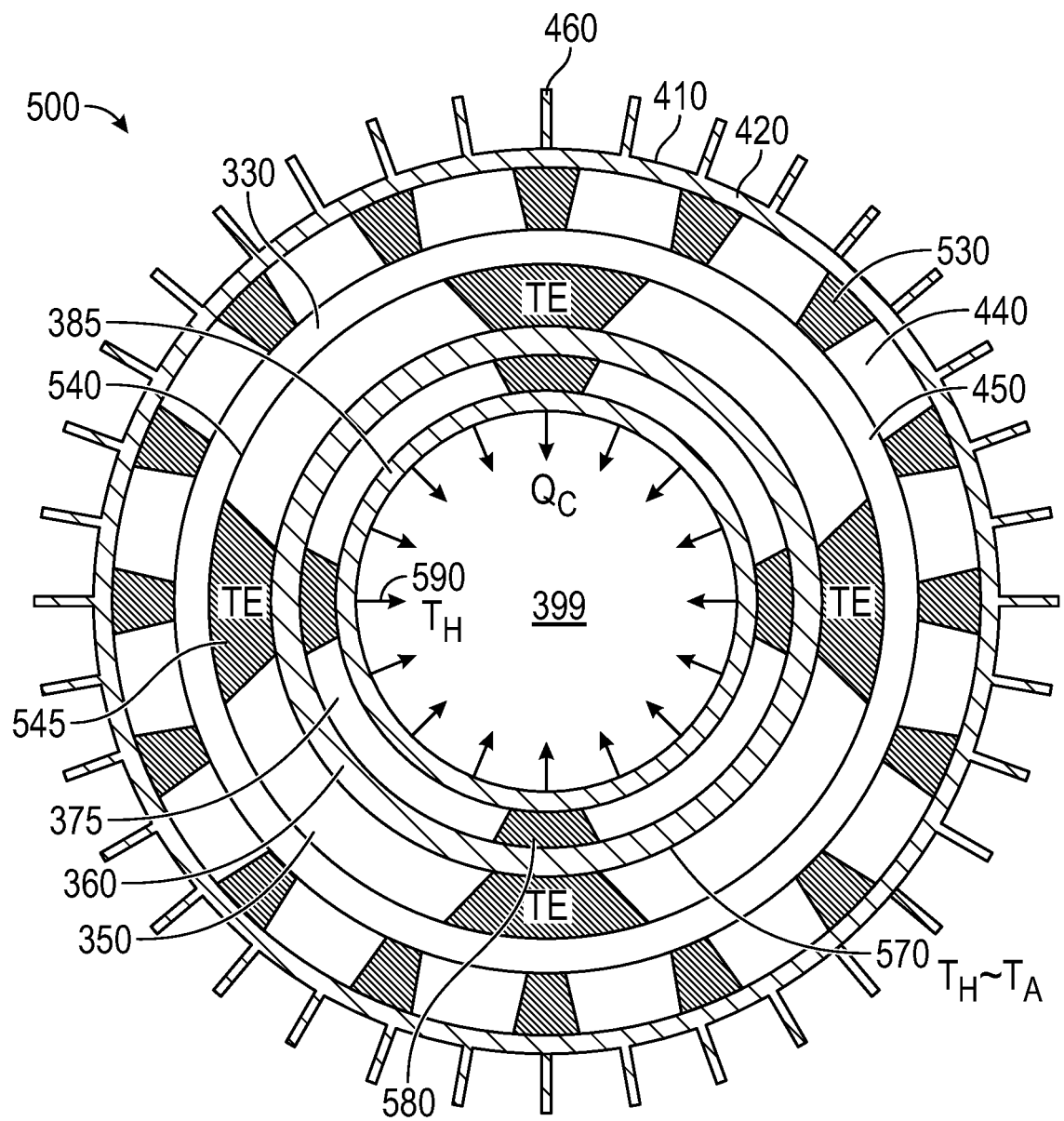
FIG. 5 is a diagram of a three-stage nested thermoelectric heater apparatus according to one embodiment of the present disclosure.

FIG. 5 shows a diagram of a nested thermoelectric heater 500 according to one embodiment of the present disclosure. The nested thermoelectric heater 500 is like the nested thermoelectric cooler 400, except that the hot and cold sides of cooling assemblies are configured or operated to reverse the heat flow such that heat flows toward the center of the nested thermoelectric assemblies. The nested thermoelectric heater 500 includes two or more heating assemblies organized so that one or more inner heating assemblies are surrounded by one or more outer heating assemblies. As shown, the nested thermoelectric heater 500 has three heating assemblies 510, 540, 570. The outer heating assembly 510 may include a housing 420 holding an insulation layer 540 that is embedded by thermoelectric modules 530, and an inner thermally conductive layer 450. The inner thermally conductive layer 450 forms the boundary for an interior space for the intermediate heating assembly 340. The housing 420 is thermally conductive and may act as a heat sink that is in thermal communication with the hot sides of the one or more thermoelectric modules 530. In some embodiments, fins 460 may be disposed on the housing 420 to aid in the removal of heat to ambient.

The intermediate heating assembly 340 may include the insulation layer 350 with one or more thermoelectric modules 545 embedded therein. The hot sides of the thermoelectric modules 545 are in thermal communication with the inner thermally conductive layer 330, and the cold sides of the thermoelectric modules 545 are in thermal communication with a thermally conductive layer 360. The thermally conductive layer 360 forms a cavity that holds the inner heating assembly 570. The inner heating assembly 570 may include an insulation layer 375 with one or more thermoelectric modules 580 embedded therein. The hot sides of the thermoelectric modules 580 are in thermal communication with the intermediate thermally conductive layer 360, and the cold sides of the thermoelectric modules 580 may be in thermal communication with a thermally conductive layer 385. The thermally conductive layer 385 forms an interior cavity 399 where articles to be maintained at cold temperatures may be stored. As shown by arrows 590, heat flows into the cavity 399 from the outer heating assembly 510.

In some embodiments, the heating assemblies 540, 570 may be configured for easy removal from the heater 500. The inner surface of the heating assembly 510 and the outer surface of the heating assembly 540 may be threaded or smooth to allow easy removal and installation. In some embodiments, the heating assembly 510 may have a separate power source from one or both inner assemblies 540, 570, so that, when separated, the temperature of the heating temperature 399 may be maintained at low temperatures. In some instances, the outermost heating assembly 510 may be used to "hot charge" the inner heating assemblies 540, 570, for instance when the inner assemblies 540, 570 have a limited power source, such as a battery, and the outer assembly 510 enjoys access to a power line. In some embodiments, the thermally conductive layers 450, 360, 385 may be made of metal. The insulation layers 440, 350, 375 are thermally insulating. In some embodiments, one or more of the insulation layers 440, 350, /375 are also electrically insulating. The insulation layers 440, 350, 375 may be made of any suitable thermally insulating material including aerogels. In some embodiments, one or more of the insulation layers 440, 350, 375 may be a vacuum, a thermal insulation based on aerogels, or a combination thereof.

The thermoelectric modules 530, 545, 580 may be single-stage, two-stage, or three-stage modules, as would be understood by a person of ordinary skill in the art. The number of stages in the thermoelectric modules 530, 545, 580 may vary from heating assembly 510, 540, 570 to heating assembly 510, 540, 570 or even with in a heating assembly 510, 540, 570. Depending on the heating temperature required, the thermoelectric modules 530, 545, 580 may be selected based on their efficiency at their respective stages (inner, intermediate, outer). The thermoelectric materials used therein may differ between the thermoelectric modules 530, 545, 580 based on these temperature performance requirements of each heating assembly 510, 540, 570. While not shown, each of the thermoelectric modules 430, 345, 380 may receive power from a power source, such as, but not limited to, a power line, battery, or inductive charging unit. In some embodiments, the thermoelectric modules 380 may be powered by electrical currents directly from the hot side of the thermoelectric modules 345, and in turn be connected to the hot side of the thermoelectric modules 430, as part of an extended electrical circuit. One or more of the thermally conducting layers 330, 360, 385 may include a phase change material (PCM) (not shown). The PCM may be embedded within one or more of the thermally conducting layers 330, 360, 385 and stabilize the temperature of the cavity 399, especially when the thermoelectric heater 500 is unpowered or has an uneven power supply. The PCMs may be different for each of the thermally conducting layers 330, 360, 385 based on the desired temperatures for the interiors of each of the respective heating assemblies 510, 540, 570. Suitable PCMs for maintaining temperatures in heating applications may include, for non-limiting examples, hydrates salts, organic solutions, solid-solid PCMs, and class A, H, S, and X PCMs available form Phase Change Material Products Limited in Hertfordshire, Great Britain.

In operation, the thermoelectric heater 500 can be operated like the thermoelectric coolers 300, 400 except with heating assemblies 510, 540, 570, which are also nested like Matryoshka dolls and each progressively providing a more intense hot. Since each assembly provides its heating, the internal cavity temperature is basically single heated (hot), double heated (very hot), or triple heated (extremely hot). Hot temperatures may be from about 40° C. to about 80° C., very hot temperatures may be from about 80° C. to about 150° C., and extremely hot temperatures may be from about 150° C. to about 300° C. For extremely hot temperatures, all the heating assemblies 510, 540, 570 may be required. For very hot temperatures, the inner assemblies 540, 570 can be removed and transported while relying on internal power and/or hot maintained by PCMs. After transportation of their contents, the assemblies 540, 570 can be reinserted in the heating assembly 510. For hot temperatures, the innermost assembly 570 may be removed and transported, or both inner assemblies 540, 570 may be removed but only one actively heating.

Figure 6:
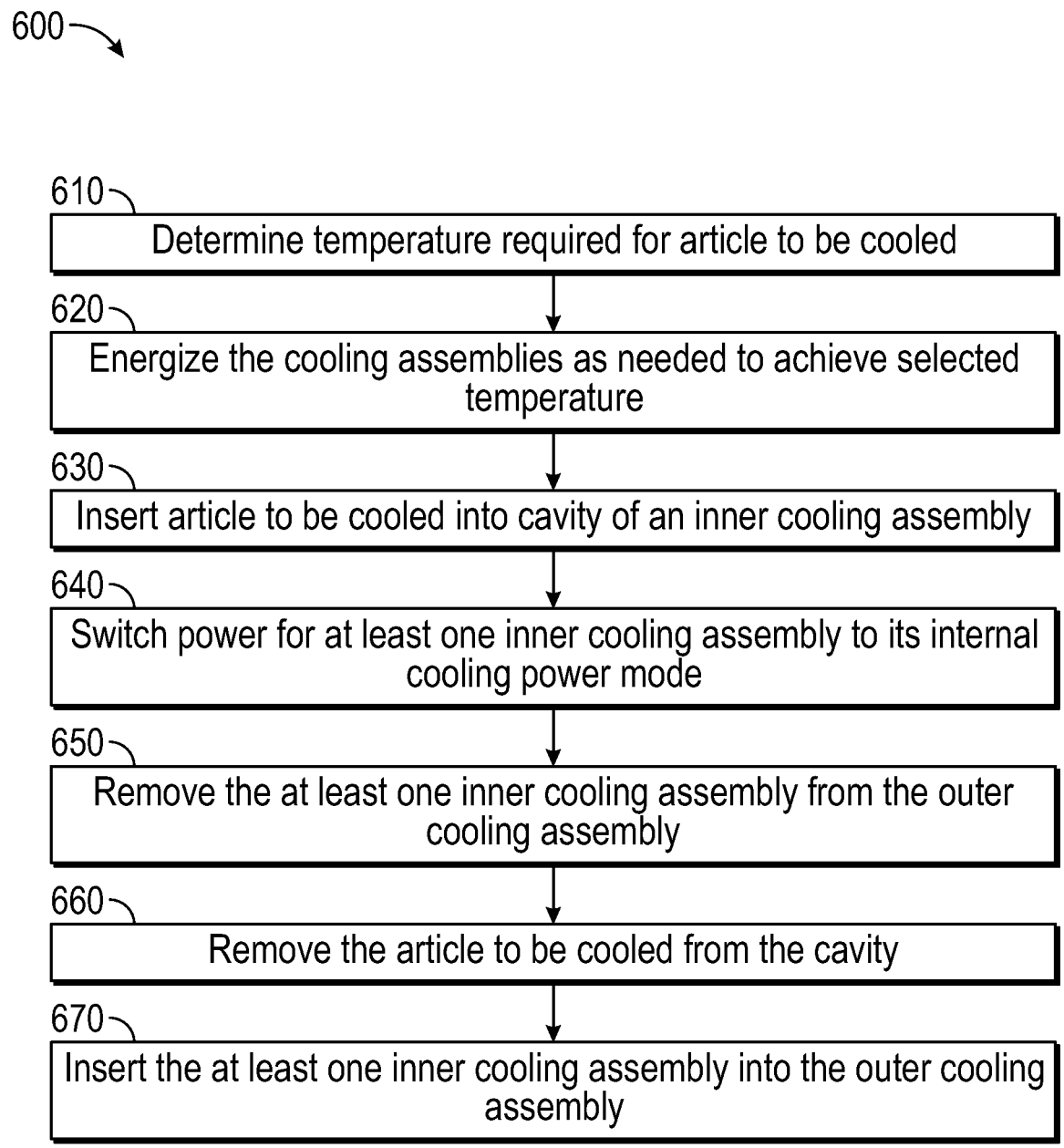
FIG. 6 is a flow chart for a method of using a nested cooling system of FIGS. 1-4 according to the present disclosure.

FIG. 6 shows a flow chart of a method 600 for using the nested cooler systems 100, 300, 400. In step 610, a cooling temperature for a desired article is selected. Selection of this temperature allows the user to decide how many cooling assemblies 150, 200, 245, 305, 340, 370, 410 are required or how much power is required to be delivered to the cooling assemblies to maintain a desired temperature. This is of importance when considering that some articles must be kept at temperatures within a narrow range and can be damaged by temperatures that are too cold or too warm. Further, the amount of power consumed by the cooling assemblies determines the maximum endurance of the system 100, 200, 300, 400 when the power supply is limited.

In step 620, several cooling assemblies 150, 200, 245, 305, 340, 370, 410 are energized based on the temperature required for the article(s) to be stored. In step 630, the article(s) are inserted in an available cavity of the system 100, 300, 400 within a nested cooling assembly 150, 200, 245 340, 370. Here the temperature can be maintained indefinitely if the system 100, 300, 400 remains powered. If the cooling is being provided where the article is needed, it may be removed at any time for use. In step, 640, if the article needs to be stored at a cold or very cold temperature for an extended period, the inner cooling assembly 150, 200, 245, 370 and/or the intermediate cooling assembly 340 may be switched to an internal power source. In step 650, the inner cooling assembly 150, 200, 245, 370 and/or the intermediate cooling assembly 340 may be removed from the system 100, 300, 400 and operate independently. In some embodiments, step 640 and step 650 may be performed out of order. In some embodiments, step 640 may be optional, especially when the power lapse at separation to the inner cooling assembly 150, 200, 245, 370 and/or the intermediate cooling assembly 340 will be momentary or the inner cooling assembly 150, 200, 245, 370 and/or the intermediate cooling assembly 340 are using reserve cold from PCMs.

In step 660, the article(s) may be removed from the inner cooling assembly 150, 200, 245, 370 and/or the intermediate cooling assembly 340 for use or storage elsewhere. In step 670, the inner cooling assembly 150, 200, 245, 370 and/or the intermediate cooling assembly 340 may be reinserted into the system 100, 300, 400. In some embodiments, several of the steps 610-670 may be performed out of order or be optional.

Figure 7:
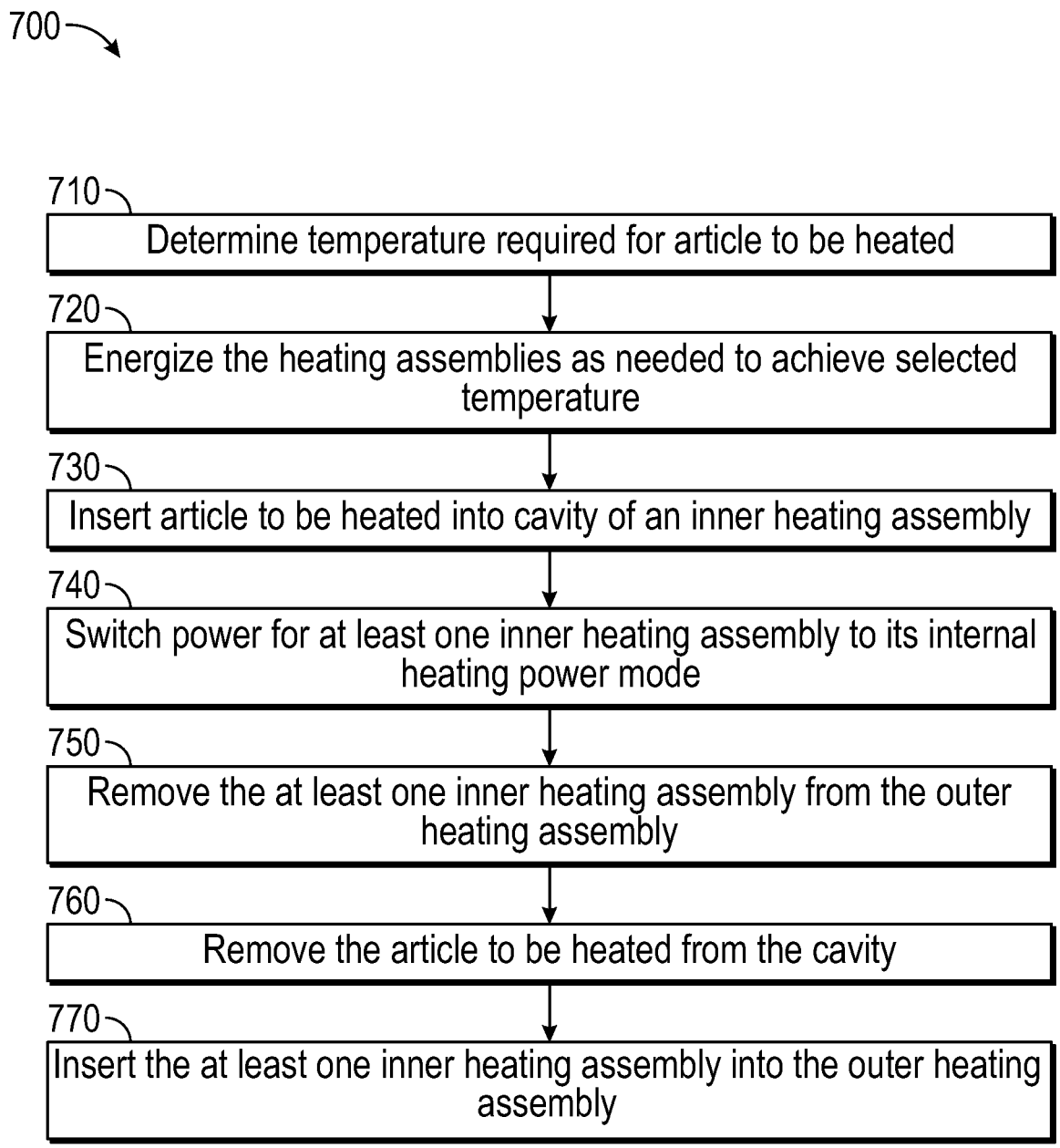
FIG. 7 is a flow chart for a method of using a nested heating system of FIG. 5 according to the present disclosure.

FIG. 7 shows a flow chart of a method 700 for using the nested heater systems 500. In step 710, a heating temperature for a desired article is selected. Selection of this temperature allows the user to decide how many heating assemblies 510, 540, 570 are required or how much power is required to be delivered to the heating assemblies to maintain a desired temperature. This is of importance when considering that some articles must be kept at temperatures within a narrow range and can be damaged by temperatures that are too cold or too warm. Further, the amount of power consumed by the heating assemblies determines the maximum endurance of the system 500 when the power supply is limited.

In step 720, several heating assemblies 510, 540, 570 may be energized based on the temperature required for the article(s) to be stored. In step 730, the article(s) are inserted in an available cavity of the system 500. Here the temperature can be maintained indefinitely if the system 500 remains powered. If the heating is being provided where the article is needed, it may be removed at any time for use. In step, 740, if the article needs to be stored at a hot or very hot temperature for an extended period, the inner heating assembly 570 and/or the intermediate heating assembly 540 may be switched to an internal power source. In step 750, the inner heating assembly 570 and/or the intermediate heating assembly 540 may be removed from the system 500 and operate independently. In some embodiments, step 740 and step 750 may be performed out of order. In some embodiments, step 740 may be optional, especially when the power lapse at separation to the inner heating assembly 570 and/or the intermediate heating assembly 540 will be momentary or the inner heating assembly 570 and/or the intermediate heating assembly 540 are using reserve hot from PCMs.

In step 760, the article(s) may be removed from the inner heating assembly 570 and/or the intermediate heating assembly 540 for use or storage elsewhere. In step 770, the inner heating assembly 570 and/or the intermediate heating assembly 540 may be reinserted into the system 500. In some embodiments, several of the steps 710-770 may be performed out of order or be optional.

Figure 8A:
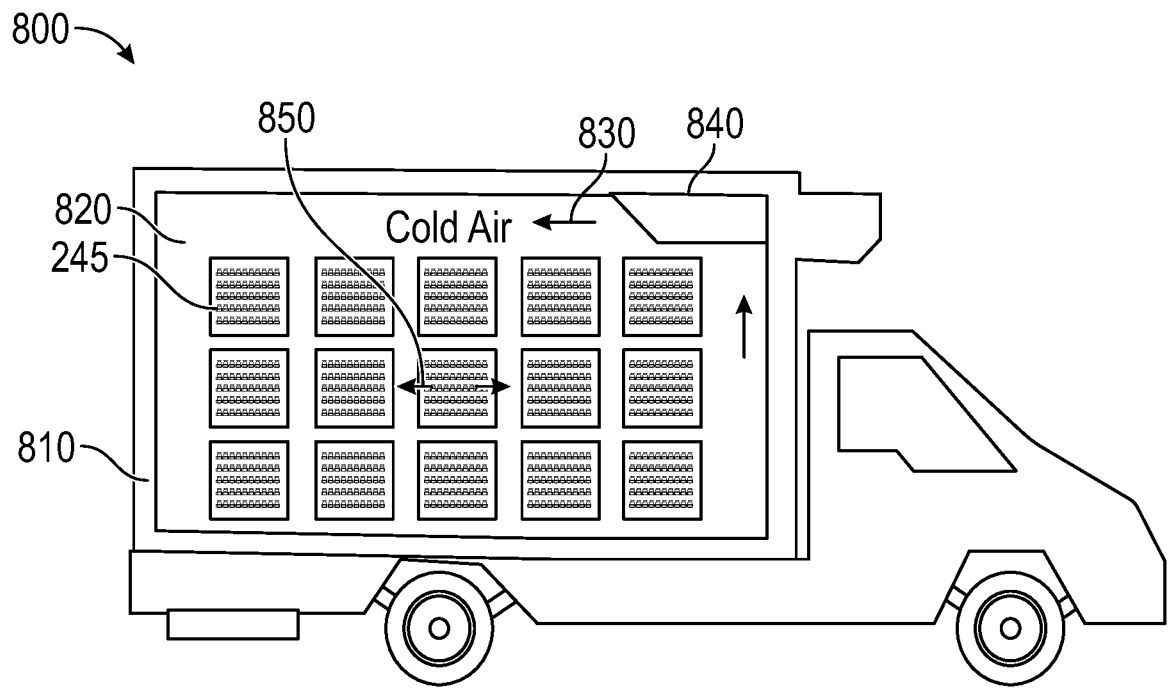
FIG. 8A is a diagram of an array of thermoelectric coolers nested in a refrigerated truck according to one embodiment of the present disclosure.

FIG. 8A shows a diagram of one system 800 for transporting a nested thermoelectric cooler, such as thermoelectric cooler 245. The system 800 may include a refrigerated truck 810 that forms a refrigerated chamber 820. Within the refrigerated chamber 820 cold air 830 may be circulated from a compressor-based air-cooling unit 840 to cool one or more thermoelectric coolers 245. The thermoelectric coolers 245 may be mounted or attached to a power source within the refrigerated truck 810. Heat 850 removed from the thermoelectric coolers 245 may be removed to the chamber 820 where it mixes with the cold air 830 and is removed to ambient air by the cooling unit 840. In some embodiments, the thermoelectric coolers 245 may operated under their own battery power while sitting within the refrigerated chamber 820.

Figure 8B:
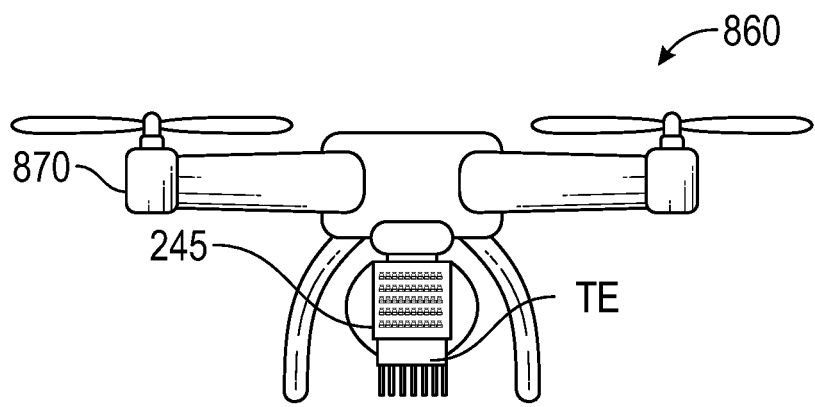
FIG. 8B is a diagram of a thermoelectric cooler disposed on an aerial drone according to one embodiment of the present disclosure.

FIG. 8B shows a diagram of another system 860, wherein a thermoelectric cooler 245 is mounted or disposed on an aerial drone 870. The thermoelectric cooler 245 may be configured for one or more of: deriving its power for cooling from the drone 870, operate on its own power, and supply power to the drone 870 from the thermoelectric cooler's power reserve.

Figure 9:
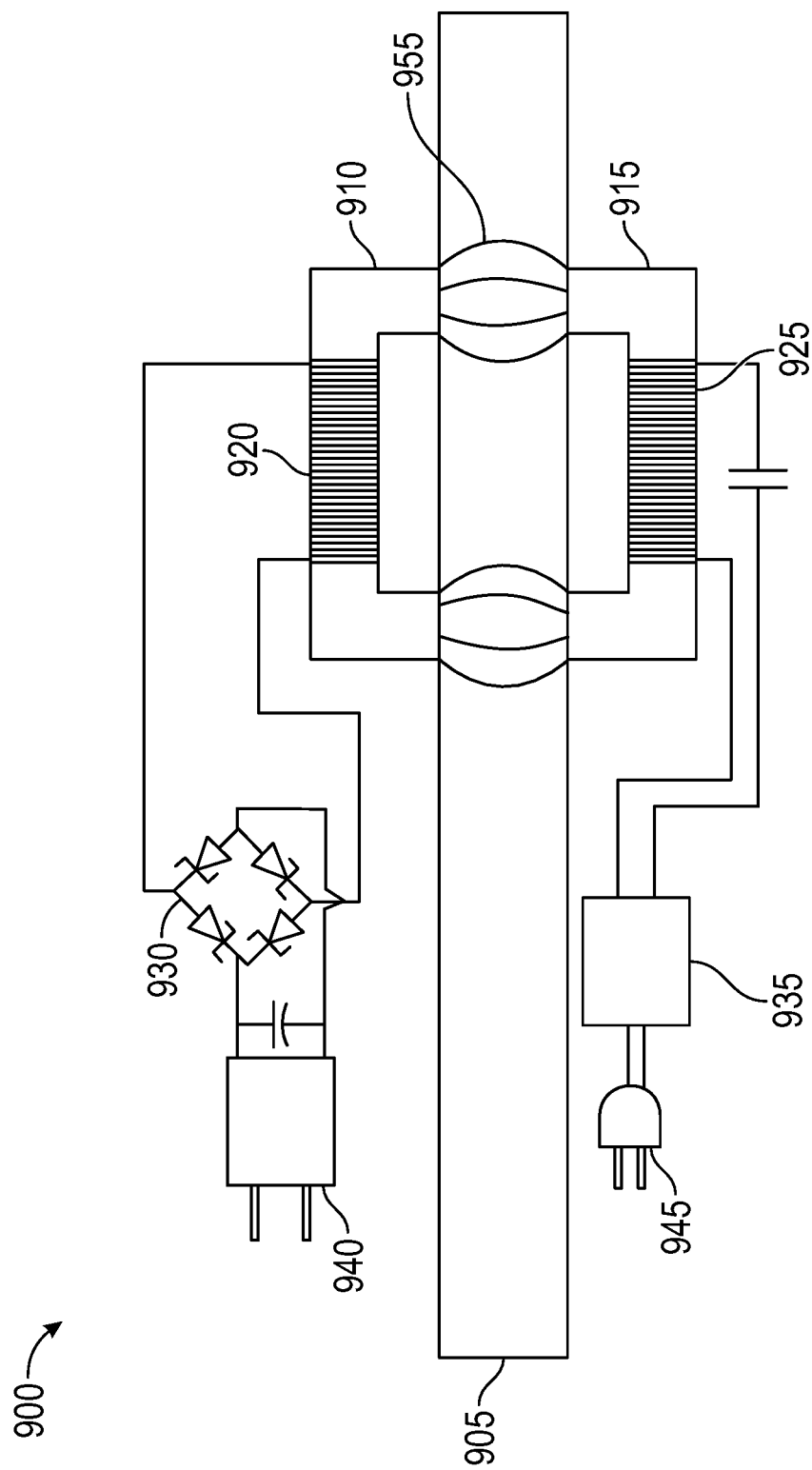
FIG. 9 is a diagram of an apparatus for delivering power to the thermoelectric heater/cooler through induction according to one embodiment of the present disclosure.

FIG. 9 shows a diagram of an inductive power circuit 900 for delivering electrical energy to a thermoelectric cooler 100, 200, 245, 300, 400, 500 according one embodiment of the present disclosure. The circuit 900 is disposed on both sides of a thermally insulated but magnetically permissive insulated wall 905. The insulated wall 905 may be one of the insulated walls 110, 205, 250, 315. The inside half of the circuit 900 is within the insulated wall 905 and includes a magnetic core 910 wound with a conductor 920 (i.e. a wire wound core). The conductor 920 is in electrical communication with a rectifier 930, which is in electrical communication with a power module 940 for a thermoelectric module 160, 215, 265, 345. The power module 940 may directly supply power to the thermoelectric module 160, 215, 265, 345 or indirectly through a battery. The outside half of the circuit 900 is outside the insulated wall 905 and includes a magnetic core 915 wound with a conductor 925. The conductor 920 is in electrical communication with a switch controller 935, which is connected to a power supply 945. The switch controller 935 is configured to generate an oscillating current that will be converted into a magnetic field by the conductor 925 and magnetic core 915. The magnetic field communicates energy in magnetic flux 955 through the insulated wall 905 where the magnetic flux 955 is converted back into an electrical signal by the conductor 920 and magnetic core 910 for transmission to the rectifier 930 and on to the power module 940. In some embodiments where the insulated wall 905 includes both the one of the insulated walls 110, 205, 250, 315 and one of the metal layers 410, 330, the metal layer 410, 330 may have an opening to allow the magnetic flux 955 to pass between the magnetic cores 910, 915 unimpeded.

Figure 10:
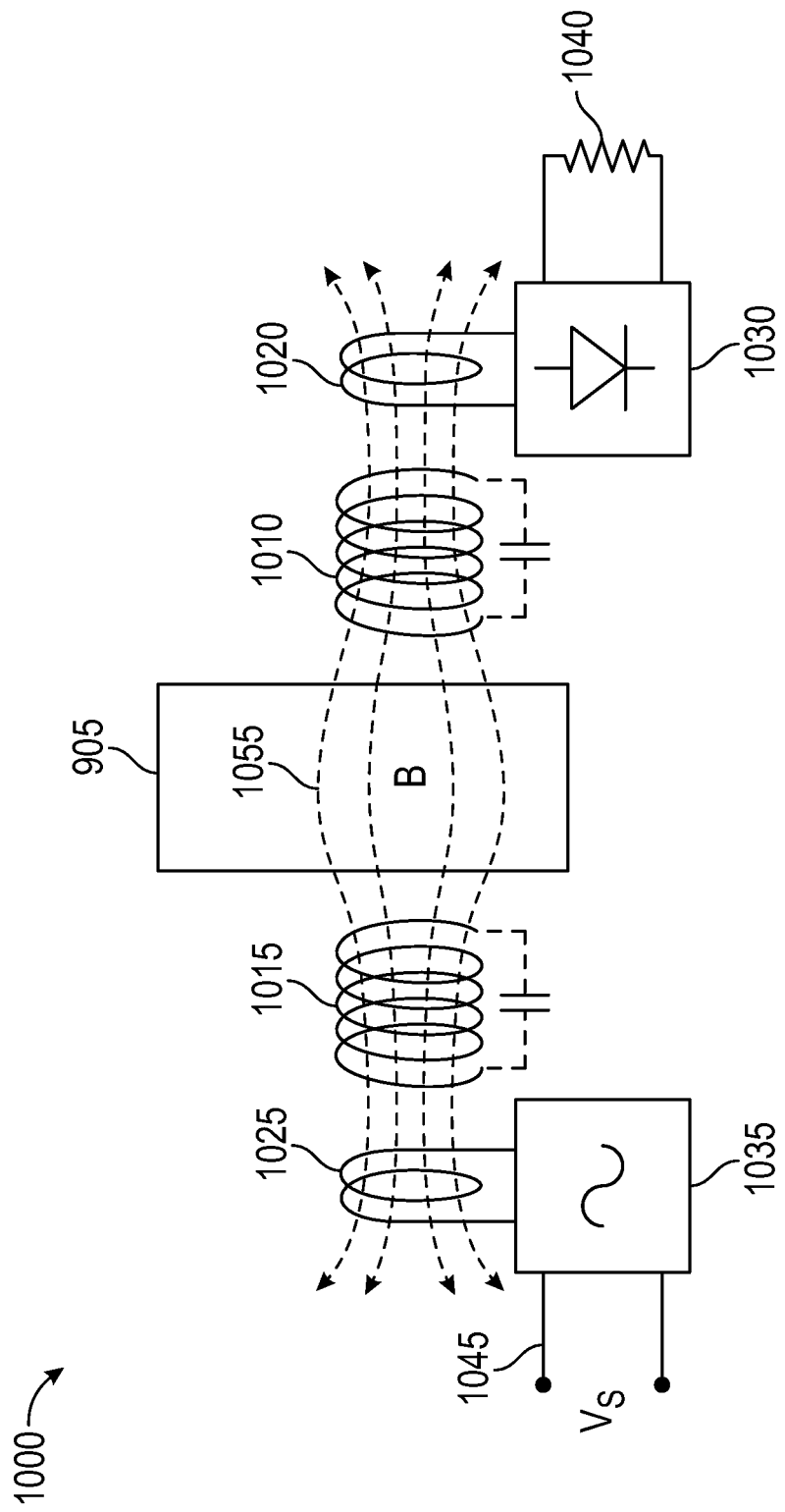
FIG. 10 is a diagram of an apparatus for delivering power to a thermoelectric heater/cooler through resonant inductive coupling according to another embodiment of the present disclosure.

FIG. 10 shows a diagram of an inductive resonance coupled circuit 1000 for delivering electrical energy to a thermoelectric cooler 100, 200, 245, 300, 400, 500 according one embodiment of the present disclosure. The circuit 1000 is disposed on both sides of the thermally insulated but magnetically permissive insulated wall 905. The inside half of the circuit 1000 is within the insulated wall 905 and includes a resonant circuit 1010 in magnetic communication with a coil 1020 in electrical communication with a rectifier 1030. The rectifier 1030 may be in electrical communication with a power load 1040, such as a thermoelectric module 160, 215, 265, 345 or a battery connected to the thermoelectric module 160, 215, 265, 345 The outside half of the circuit 1000 is outside the insulated wall 905 and includes a resonant circuit 1015 in magnetic communication with a coil 1025 in electrical communication with an oscillator 1035. The oscillator 1035 is in electrical communication with to a power supply 1045. The oscillator 1035 is configured to generate an oscillating current that will be converted into a magnetic field by the coil 1025. The magnetic field from the coil 1025 is transmitted to the resonant circuit 1015 and communicates energy in magnetic flux 1055 through the insulated wall 905 where the magnetic flux 1055 is received by the resonant circuit 1010, which transmits the magnetic flux 1055 to the coil 1020 that converts it back into an electrical signal for transmission to the rectifier 1030 and on to the power load 1040. In some embodiments where the thermally insulated wall 905 includes both the one of the thermally insulated walls 110, 205, 250, 315 and one of the metal layers 410, 330, the metal layer 410, 330 may have an opening to allow the magnetic flux 1055 to pass between the resonant circuits 1010, 1015 unimpeded.

Figure 11:
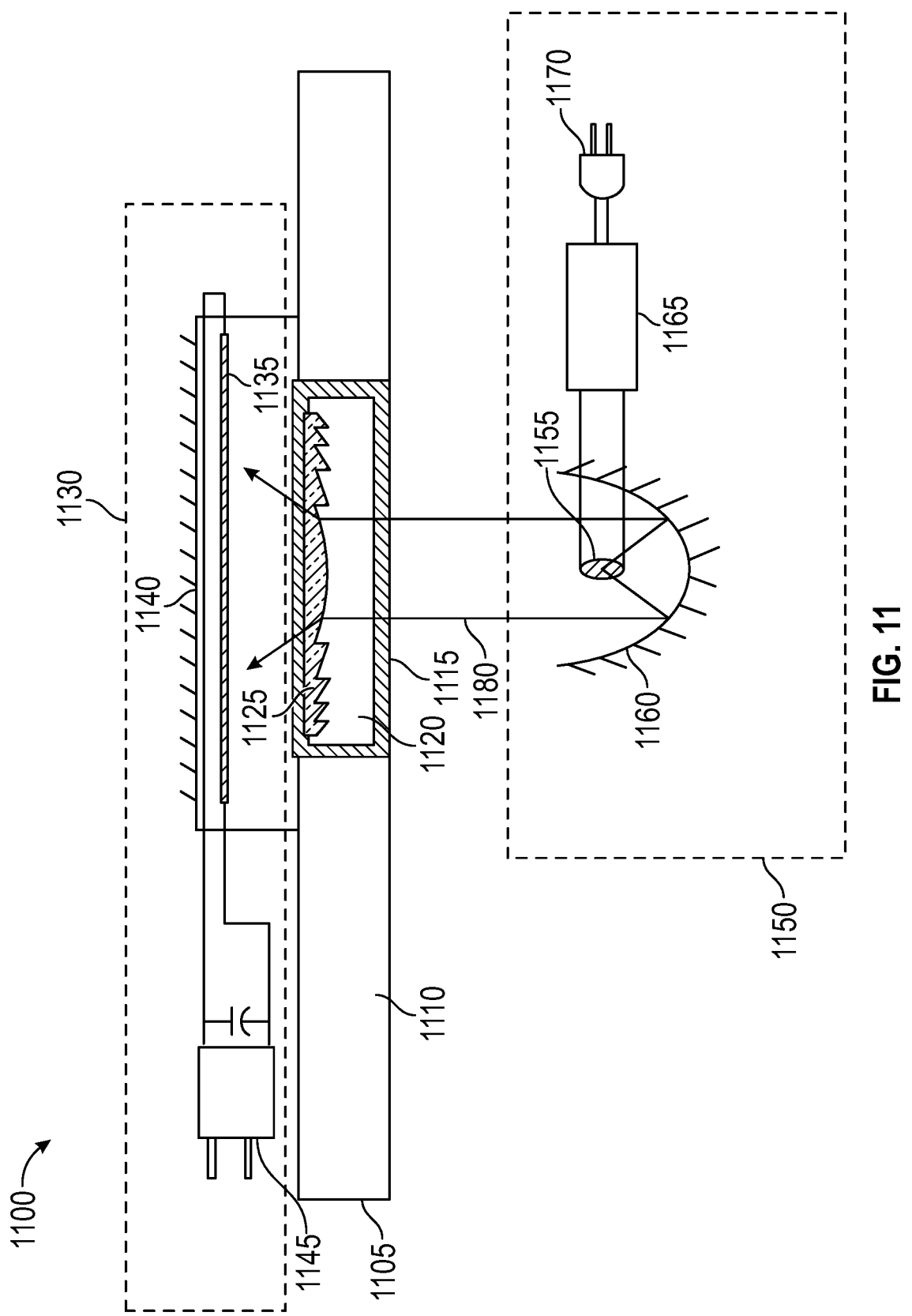
FIG. 11 is a diagram of an apparatus for delivering power to a thermoelectric heater/cooler using electromagnetic radiation according to one embodiment of the present disclosure.

FIG. 11 shows a diagram an optical power circuit 1100 for delivering power to a thermoelectric cooler 100, 200, 245, 300, 400, 500 according one embodiment of the present disclosure. The circuit 1100 includes a receiver 1130 and a transmitter 1150 that are disposed on opposite sides of a thermally insulated wall 1105. The thermally insulated wall 1105 includes a thermal insulation material 1110, such as in one of the insulated walls 110, 205, 250, 315. In some embodiments where the thermally insulated wall 1105 includes both the one of the insulated walls 110, 205, 250, 315 and one of the metal layers 410, 330. The thermally insulated wall 1105 includes a sealed window 1115 that allows electromagnetic radiation to pass through a portion of the insulated wall 1105. The sealed window 1115 may be made of glass, plastic, sapphire, or any other suitable transparent material. The sealed window 1115 may enclose a transparent interior 1120 containing a vacuum or an aerogel or another suitable electromagnetic radiation transparent, thermally insulated material or an inert gas such as argon or nitrogen. The sealed window 1115 may also include, optionally, a lens 1125 for focusing electromagnetic radiation, such as a Fresnel lens. Herein, it is contemplated that the transparency of the sealed window 1115 and optional lens 1125 are not limited to visible light, but may include other forms of electromagnetic radiation, including microwaves and radio waves. In some embodiments, the sealed window 1115 and the lens 1125 may be visibly opaque or translucent while being transparent to selected wavelengths of electromagnetic radiation 1180 used by the receiver 1130 and the transmitter 1150.

The receiver 1130 may include a photovoltaic cell 1135 configured to convert selected wavelengths of electromagnetic radiation 1180 into electricity. The photovoltaic cell 1135 may be single or double-sided (bifacial). The receiver 1130 may include a mirror 1140 disposed such that the photovoltaic cell 1135 is between the mirror 1140 and the sealed window 1115. The mirror 1140 is selected to reflect electromagnetic radiation 1180 of at least wavelengths that are to be absorbed by the photovoltaic cell 1135, such that electromagnetic radiation 1180 not absorbed by one side of the photovoltaic cell 1135 may be redirected to be absorbed by the other side of the photovoltaic cell 1135. The photovoltaic cell 1135 is in electrical communication with a power regulator 1145 which uses the electrical signal from the photovoltaic cell 1135 to power a thermoelectric device or charge a battery.

The transmitter 1150 may include an electromagnetic radiation source 1155, such as a light emitting diode, laser, or vapor lamp. The electromagnetic radiation source 1155 may be disposed in a curved mirror 1160, such as a parabolic mirror, to focus its output on the sealed window 1115. A power driver 1165 supplies electrical energy to the electromagnetic radiation source 1155 for conversion from electrical energy to electromagnetic radiation 1180. The power driver 1165 may receive power from a power source 1170 such as a generator, power grid, or battery bank.

In operation, the transmitter 1150 generates electromagnetic radiation 1180 via the electromagnetic radiation source 1155. The electromagnetic radiation 1180 may be focused by the curved mirror 1160 and directed into the sealed window 1115, where it passes through the interior 1120 and is optionally focused on the photovoltaic cell 1135 by the lens 1125. Some of the electromagnetic radiation 1180 not absorbed by the photovoltaic cell 1135 may be reflected by optional mirror 1140 back to the photovoltaic cell 1135 for a second opportunity to be absorbed. The electrical energy produced by the photovoltaic cell 1135 is processed by the power regulator 1145 into a condition that may be used for operating an electrical device such a running a thermoelectric module or charging a battery.

Figure 12:
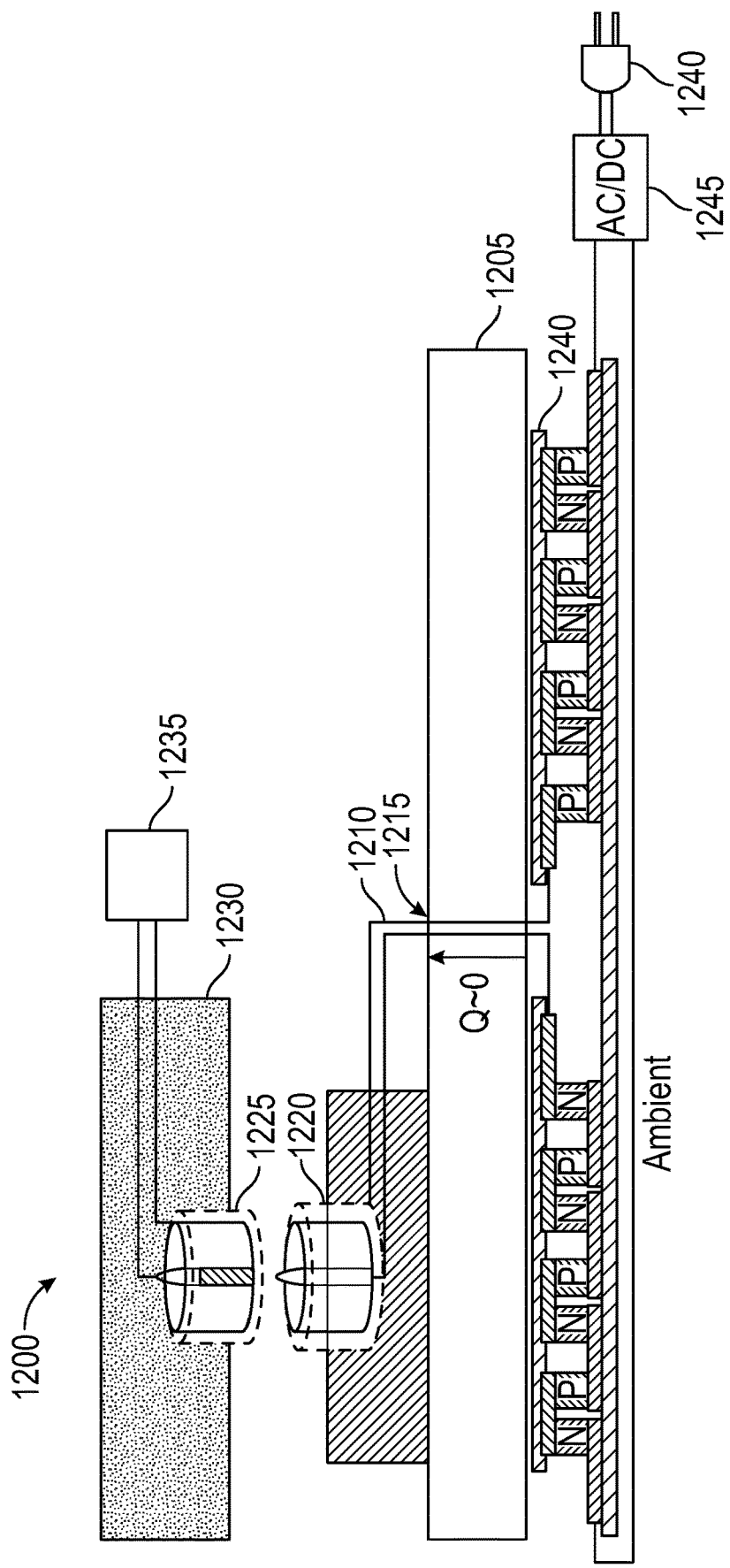
FIG. 12 is a diagram of an apparatus for delivering power to a thermoelectric heater/cooler using a wired connection according to one embodiment of the present disclosure.

FIG. 12 shows a power circuit 1200 that compensates for thermal leakage through penetrations and wires according to one embodiment of the present disclosure. The power circuit 1200 includes an electrical wire 1210 that penetrates a thermally insulated wall 1205. The thermally insulated wall 1205 may be similar to the thermally insulated walls 905, 1105 with a penetration 1215 extending through the same. The electrical wire 1210 may connect to a socket/plug 1220 configured to mate with a plug/socket 1225 mounted on another thermally insulated wall 1230 for an interior thermoelectric device and in electrical communication with an electrical load 1235, such as the thermoelectric module 160, 215, 265, 345, 380, 430, 530 or a battery. The electrical wire 1210 is in electrical communication with a thermoelectric module 1240 disposed proximate to the position of the penetration 1215. The thermoelectric module 1240 is in electrical communication with an optional AC/DC converter 1245, which receives power from a power source 1250. In some embodiments, the thermoelectric module 1240 may be smaller than electrical load 1235.

In operation, electrical power from the power source 1250 is communicated to the thermoelectric module 1240, where it performs two functions. Some of electrical energy transmitted through electrical wire 1210 to the load 1235, and some of the electrical energy is used to power the thermoelectric module 1240 to generate a temperature differential to counter thermal leakage across the thermally insulated wall 1205 due to the penetration 1215 and thermal conduction through the electrical wire 1210. In some embodiments, the penetration 1215 in the thermally insulated wall 1205 may be a pre-existing port through which the electrical wire 1210 is run.

While the disclosure has been described with reference to exemplary embodiments, it will be understood that various changes may be made and equivalents may be substituted for elements thereof without departing from the scope of the disclosure. In addition, many modifications will be appreciated to adapt a particular instrument, situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A nested thermal cooler system, the system comprising:
    a first cooling assembly comprising:
        a first housing;
        a first cooling apparatus inside the first housing; and
        a first thermal conductive layer forming a first cavity inside the first housing;
    a second cooling assembly disposed within the first cavity, the second cooling assembly comprising:
        a second housing;
        a second cooling apparatus comprising at least one thermoelectric module embedded in the second housing; and
        a second thermal conductive layer forming a second cavity inside the second housing;
    a first wire wound magnetic core disposed inside the first housing;
    a second wire wound magnetic core disposed outside the first housing, wherein the second wire-wound magnetic core is proximate to the first wire wound magnetic core;
    a rectifier circuit in electrical communication with the first wire wound magnetic core; and
    a power regulator in electrical communication with the rectifier circuit.

2. The system of claim 1, wherein the first housing and the second housing are thermally insulated.

3. The system of claim 1, wherein the first cooling apparatus is one of: a vapor compressor cooling apparatus and a thermoelectric cooler.

4. The system of claim 1, wherein at least one of the first conductive layer and the second conductive layer comprises:
a thermally conductive material; and
a phase change material embedded in the thermally conductive material.

5. The system of claim 4, wherein the phase change material in the first conductive layer is different from the phase change material in the second conductive layer.

6. The system of claim 1, further comprising at least one power source in electrical communication with the at least one thermoelectric module.

7. The system of claim 1, wherein the second cooling assembly is configured for removal and insertion into the first cooling assembly.

8. The system of claim 1, further comprising:
a third cooling assembly disposed within the second cavity, the third cooling assembly comprising:
a third housing;
a third cooling apparatus comprising at least one thermoelectric module embedded in the third housing; and
a third thermal conductive layer forming a third cavity inside the third housing.

9. A method of cooling using a nested thermal cooler system, the system comprising:
a first cooling assembly comprising:
a first housing;
a first cooling apparatus inside the first housing;
a first thermal conductive layer forming a first cavity inside the first housing; and
a second cooling assembly disposed within the first cavity, the second cooling assembly comprising:
a second housing;
a second cooling apparatus comprising at least one thermoelectric module embedded in the second housing; and
a second thermal conductive layer forming a second cavity inside the second housing; and
the method comprising:
energizing the first cooling assembly and the second cooling assembly, and
removing the second cooling assembly from the first cavity.

10. The method of claim 9, further comprising:
cooling a container of COVID vaccine into the second cavity.

11. A nested thermal cooler system, the system comprising:
a first cooling assembly comprising:
a first housing;
a first cooling apparatus inside the first housing; and
a first thermal conductive layer forming a first cavity inside the first housing;
a second cooling assembly disposed within the first cavity, the second cooling assembly comprising:
a second housing;
a second cooling apparatus comprising at least one thermoelectric module embedded in the second housing; and
a second thermal conductive layer forming a second cavity inside the second housing;
a pair of resonant inductive circuits disposed on opposite sides of a wall of the first housing;
a first magnetic antenna coil in magnetic communication with one of the pair of resonant inductive circuits;
a signal oscillator in electrical communication with the magnetic antenna coil;
a second magnetic antenna coil in magnetic communication with the other of the pair of resonant inductive circuits;
a rectifier circuit in electrical communication with the second magnetic antenna coil; and
a power regulator in electrical communication with the rectifier circuit.

12. The system of claim 11, wherein the first cooling apparatus is one of: a vapor compressor cooling apparatus and a thermoelectric cooler.

13. The system of claim 11, wherein at least one of the first conductive layer and the second conductive layer comprises:
a thermally conductive material; and
a phase change material embedded in the thermally conductive material.

14. The system of claim 11, wherein the phase change material in the first conductive layer is different from the phase change material in the second conductive layer.

15. The system of claim 11, further comprising at least one power source in electrical communication with the at least one thermoelectric module.

16. The system of claim 11, wherein the second cooling assembly is configured for removal and insertion into the first cooling assembly.

17. The system of claim 11, further comprising:
a third cooling assembly disposed within the second cavity, the third cooling assembly comprising:
a third housing;
a third cooling apparatus comprising at least one thermoelectric module embedded in the third housing; and
a third thermal conductive layer forming a third cavity inside the third housing.

18. A nested thermal cooler system, the system comprising:
a first cooling assembly comprising:
a first housing;
a first cooling apparatus inside the first housing; and
a first thermal conductive layer forming a first cavity inside the first housing;
a second cooling assembly disposed within the first cavity, the second cooling assembly comprising:
a second housing;
a second cooling apparatus comprising at least one thermoelectric module embedded in the second housing; and
a second thermal conductive layer forming a second cavity inside the second housing;
an electromagnetic radiation transmitter disposed outside the first housing; wherein the first housing comprises a window transparent to selected wavelengths of electromagnetic radiation and thermally insulated;
an electromagnetic radiation receiver disposed inside the first housing and configured to convert the selected wavelengths of electromagnetic radiation to electrical power; and
a power regulator in electrical communication with the electromagnetic radiation receiver.

19. The system of claim 18 wherein the first cooling apparatus is one of: a vapor compressor cooling apparatus and a thermoelectric cooler.

20. The system of claim 18 wherein at least one of the first conductive layer and the second conductive layer comprises:
   a thermally conductive material; and
   a phase change material embedded in the thermally conductive material.

21. The system of claim 20, wherein the phase change material in the first conductive layer is different from the phase change material in the second conductive layer.

22. The system of claim 18, further comprising at least one power source in electrical communication with the at least one thermoelectric module.

23. The system of claim 18, wherein the second cooling assembly is configured for removal and insertion into the first cooling assembly.

24. The system of claim 18, further comprising:
   a third cooling assembly disposed within the second cavity, the third cooling assembly comprising:
      a third housing;
      a third cooling apparatus comprising at least one thermoelectric module embedded in the third housing; and
      a third thermal conductive layer forming a third cavity inside the third housing.

25. A nested thermal cooler system, the system comprising:
   a first cooling assembly comprising:
      a first housing;
      a first cooling apparatus inside the first housing; and
      a first thermal conductive layer forming a first cavity inside the first housing;
   a second cooling assembly disposed within the first cavity, the second cooling assembly comprising:
      a second housing;
      a second cooling apparatus comprising at least one thermoelectric module embedded in the second housing; and
      a second thermal conductive layer forming a second cavity inside the second housing;
   wherein the second cooling assembly is configured for removal and insertion into the first cooling assembly.

26. The system of claim 25, wherein the first cooling apparatus is one of: a vapor compressor cooling apparatus and a thermoelectric cooler.

27. The system of claim 25, wherein at least one of the first conductive layer and the second conductive layer comprises:
   a thermally conductive material; and
   a phase change material embedded in the thermally conductive material.

28. The system of claim 27, wherein the phase change material in the first conductive layer is different from the phase change material in the second conductive layer.

29. The system of claim 25, further comprising at least one power source in electrical communication with the at least one thermoelectric module.

30. The system of claim 25, further comprising:
   a third cooling assembly disposed within the second cavity, the third cooling assembly comprising:
      a third housing;
      a third cooling apparatus comprising at least one thermoelectric module embedded in the third housing; and
      a third thermal conductive layer forming a third cavity inside the third housing.

\* \* \* \* \*